(12) United States Patent
Splithof

(10) Patent No.: US 7,009,451 B2
(45) Date of Patent: Mar. 7, 2006

(54) IMAGE DISPLAY APPARATUS AND HIGH VOLTAGE DRIVER CIRCUIT

(75) Inventor: Mike Hendrikus Splithof, Nijmegen (NL)

(73) Assignee: Koninklijke Philips Electronics, N.V., Eindhoven (NL)

(*) Notice: Subject to any disclaimer, the term of this patent is extended or adjusted under 35 U.S.C. 154(b) by 78 days.

(21) Appl. No.: 10/495,956

(22) PCT Filed: Oct. 24, 2002

(86) PCT No.: PCT/IB02/04455

§ 371 (c)(1),
(2), (4) Date: May 18, 2004

(87) PCT Pub. No.: WO03/044948

PCT Pub. Date: May 30, 2003

(65) Prior Publication Data
US 2005/0001686 A1 Jan. 6, 2005

(30) Foreign Application Priority Data
Nov. 22, 2001 (EP) ................... 01204454

(51) Int. Cl.
*H03F 3/26* (2006.01)
(52) U.S. Cl. ............ 330/263; 330/255; 330/267
(58) Field of Classification Search ........ 330/255, 330/263, 267
See application file for complete search history.

(56) References Cited

U.S. PATENT DOCUMENTS

| 5,038,114 A | 8/1991 | Blanken et al. ............. 330/288 |
| 5,373,249 A * | 12/1994 | Barrett et al. ............... 330/264 |
| 6,429,744 B1 * | 8/2002 | Murray et al. ............. 330/267 |

FOREIGN PATENT DOCUMENTS

| JP | 2296408 | 12/1996 |
| WO | WO9639743 | 12/1996 |

* cited by examiner

*Primary Examiner*—Steven J. Mottola

(57) ABSTRACT

A driver circuit of an image display apparatus comprises driver circuit with a class A/B push-pull stage (T3, T5). The driver circuit contains an n-type pull transistor (T3), an n-type control transistor (T2) with a main current channel terminal coupled to a control electrode of the pull transistor (T2) and a voltage source (V) applying a predetermined voltage over a series connection of the control electrode-main current channel terminals of the control transistor (T2) and the pull transistor (T3). The current from the control transistor (T2) flows to a p-type push transistor (T5) via a current mirror (T4, T5). An input transistor (T1) draws all of the current from the control transistor (T2) via a node (142) between the control transistor (T2) and the pull transistor (T3) to control the ratio between the currents through these transistors (T2, T3). The input of the driver circuit has a direct control over the current through the input transistor (T1) that does not include a feedback through the control transistor (T2).

9 Claims, 1 Drawing Sheet

IMAGE DISPLAY APPARATUS AND HIGH VOLTAGE DRIVER CIRCUIT

The invention relates to an image display apparatus, a high voltage driver circuit for driving a display screen device in such an apparatus, and more generally to a high voltage driver circuit.

A high voltage swing with high frequency is needed to drive an image display screen device such as a CRT. The output swing may be more than a hundred Volts. This makes it of prime importance to minimize the amount of current that leads to dissipated power in the driver circuit of the display screen device. A well known technique to minimize the power dissipated in driver circuits is the use of a Class A/B push pull output stage. A class A/B push-pull output stage is an output stage that draws a certain quiescent current, but is able to supply more output current than the quiescent current.

The class A/B output stage contains a push transistor connected between the output and a first power supply and a pull transistor connected between the output and a second power supply. Class A/B operation is realized by driving the push and pull transistor so that the current through one of the transistors can increase more than the decrease in the current through the other transistor when the latter current nears zero. Thus, the maximum output current is higher than the quiescent current. As a result a low quiescent current may be used, which leads to a small power dissipation in the output stage.

WO 96/39743 discloses an amplifier with a push-pull output stage with an n-type pull transistor and a p-type push transistor, so that the push-pull transistors are of mutually complementary type. The p-type transistor is arranged as the output stage of a p-type current mirror. Both the current through the n-type pull transistor and the input current of the p-type current mirror are controlled by an input voltage. A control circuit controls the currents in a complementary way so that one current rises and the other falls when the input voltage rises.

The input current that the control circuit feeds to the p-type current mirror can also significantly contribute to power consumption, especially when the gain of the p-type current mirror is low. To ensure low power consumption the control circuit feeds this input current to the p-type current mirror in such a way that little quiescent input current is needed. WO 96/39743 realizes this by using one output of a long tailed pair differential amplifier to supply current to the p-type current mirror. The tail current of this long-tailed pair is controlled with a feedback loop so that the tail current increases when increasing current is supplied to the p-type current mirror.

The base of a first transistor of the pair receives the input voltage and the collector of a second transistor of the pair feeds the input current to the p-type current mirror. A constant voltage V is applied to the base of the second transistor. The feedback loop adjusts the current Isup from the current source of the long tailed pair in proportion to the current through the second transistor. Thus, it is ensured that on one hand the quiescent current is low and on the other hand a much larger current can be supplied to the input of the p-type current mirror.

Unfortunately, the added feedback loop needed to adjust the current from the current source of the long tailed pair slows down the circuit. This feedback loop also contains additional p-type transistors that limit the speed of the circuit more than n-type transistors. This makes the circuit of WO 96/39743 less useful for driving a display screen device, because high frequency operation is essential for such a device.

U.S. Pat. No. 5,038,114 shows a current amplifier that could also serve as input to a p-type current mirror and pull transistor of a push-pull stage. This amplifier contains a bipolar control transistor whose main current channel could feed the input of the p-type current mirror that contains the push transistor of the class A/B stage. The base-emitter junction of the control transistor is connected in series with the base emitter junction of a bipolar n-type output transistor that could serve as pull transistor of the class A/B stage. A constant voltage is applied across the series connection of both junctions. The n-type output transistor is the output of an n-type current mirror, whose is coupled to the main current channel of the control transistor.

An input current is fed to a node between the input of the n-type current mirror and the main current channel of the control transistor. Thus, the input current determines the difference between the current through the control transistor and the current through the n-type current mirror (which equals the current through the n-type pull transistor). At the same time the constant voltage over the series connection of the base-emitter junctions ensures that the product of the current through the control transistor and the n-type output transistor is constant.

This amplifier supports class A/B operation because it makes the current at one output go to zero when the current at the other output becomes very large and vice versa. However, unless large input currents of both positive and negative polarity can be provided, this amplifier must rely for its amplification on the amplification of the current mirrors. Therefore an amplifying p-type current mirror would have to be used in the push-pull stage, which limits the speed of the push-pull stage. This also makes this circuit less useful for driving a display screen device, because high frequency operation is essential for such a device.

Amongst others, it is an object of the invention to provide for an image display apparatus in which a display screen device can be driven at high speed and with low power consumption.

It is another object of the invention to provide for a driver circuit that can provide a high voltage swing at high frequencies with low power consumption in the driver circuit.

The invention is defined by the independent claims. The dependent claims define advantageous embodiments.

The invention is based on the principle that the control transistor and the pull transistor provide complementary currents suitable for a class AB push-pull stage when the sum of their control voltages is controlled by the voltage source. Changes in the current distribution between the control transistor and the pull transistor are controlled by an external input signal, by drawing the changing part of the current from the main current channel of the control transistor from a node between the control transistor and the n-type output transistor. Substantially all of the input dependent variable part of this current (except relatively small currents such as for example leakage currents), and preferably even all of this current, is drawn from the node with the main current channel of an input transistor, and therefore effectively with a high impedance current source.

The current through input transistor is controlled directly from the input of the amplifier, i.e. not via a feedback loop through the control transistor that affects the way the current through the input transistor depends on the input voltage, other than through the intrinsic feedback properties of the input transistor (such as the early effect). In this way the speed of the amplifier is not compromised. It may be noted that the current through the input transistor may of course also be controlled by a feedback loop from the output of the push-pull stage to the input of the amplifier, in addition to control by the input voltage. Thus, the current through the input transistor may depend on the current through the control transistor, but this does not detract from the fact that the input that provides the external input signal has a coupling to the input transistor that does not include a feedback loop through the control transistor, so that the control transistor does not affect the direct relation between the current through the input transistor and the input voltage, i.e. the dependence of the former on the latter.

Thus, the current through any one of the control transistor and the n-type output transistor can be made very large, while at the same time making the current through the other one of the transistors very small, either by raising the current through the input transistor so as to make the current through the control transistor large or by making the current through the input transistor small, thereby inversely raising the current through the n-type output transistor. The current raise is not limited by the quiescent current of the transistor that draws this raised current (control transistor or n-type output transistor) and not slowed down by a feedback loop.

It will be appreciated that the word "transistor" as used herein refers to an area of semi-conductor substrate with a transistor function, be it a single coherent area or a combination of a number of discrete areas that provide main current channels in parallel and that each have a transistor function.

In an embodiment the driver circuit has two functionally identical branches, each with an input transistor, a control transistor and a pull transistor interconnected according to the invention, wherein the main current channels of the input transistors of the two branches are coupled to a supply connection in common via a high impedance circuit such as preferably a current source. Thus, the input voltages of the input transistors in the respective branches at which a quiescent state is realized, depend only on the difference of the input voltages, not on intrinsic properties of the circuit.

Furthermore, the main current channels of the pull transistors and the control transistors in the two branches are preferably cross-connected, at least as far as they are connected to the input of the current mirror. Thus a larger variation in the push current is made possible. Preferably the pull transistors and control transistors in both two branches are cross-connected. Thus a minimum of current is lost.

These and other advantageous objects and aspects of the image display apparatus and circuit according to the invention will be described in more detail using the following Figs.

Figure 1:
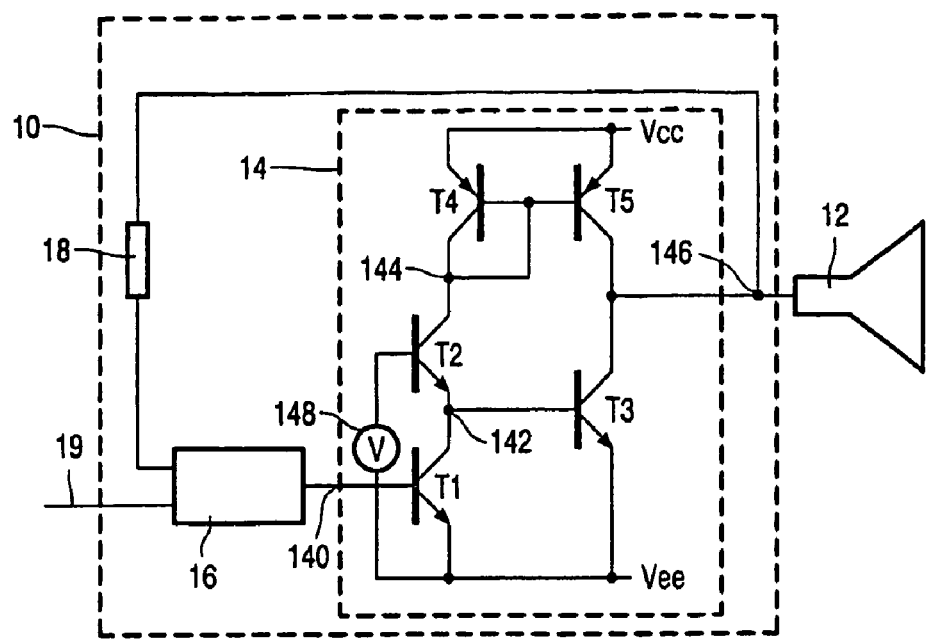
FIG. 1 shows an image display apparatus according to the invention.

FIG. 1 shows an image display apparatus with a drive circuit 10 and a display screen device 12, which is a CRT. The drive circuit 10 contains a driver stage 14, a preamplifier 16 and a feedback circuit 18. Input 19a of the drive circuit 10 is coupled to an input of the preamplifier 16, which has an output coupled to an input of the driver stage 14. An output of the driver stage 14 is coupled to a control electrode of the image display device 12 and to a further input 19b of the preamplifier 16 via the feedback circuit 18. The driver stage 14 contains an npn input transistor T1, an npn control transistor T2, an npn pull transistor T3 and a current mirror T4, T5, with a pnp mirror input transistor T4 and a pnp mirror output transistor T5. Input 140 of the driver stage 14 is coupled to the control electrode of the input transistor T1. The main current channel of the input transistor T1 is connected between a first power supply Vee and a node 142. The main current channel of the control transistor T2 is coupled between the node 142 and an input 144 of the current mirror T4, T5. The control electrode of the control transistor T2 is coupled to a voltage source 148. A control electrode of the pull transistor T3 is coupled to the node 142 and its main current channel is coupled between the first power supply Vee and an output 146 of the drive stage. The input transistor T4 of the current mirror is coupled as a diode (control electrode to main current channel) between the input 144 of the current mirror and a second power supply connection Vcc. The output transistor T5 of the current mirror has a control electrode coupled to the input 144 of the current mirror and its main current channel is coupled between the second power supply connection Vcc and the output of the drive stage 14.

In operation the drive circuit 10 receives an input signal (for example a video signal) at input 19a and drives a control electrode (for example the cathode) of the image display device 12. Although the drive circuit may drive the cathode directly, as shown, without deviating from the invention one or more buffer stages, such as a complementary emitter follower stage (or source follower stage) may be added between the driver and the control electrode of the image display device 12. The feedback circuit 18 ensures a well-defined gain and substantially linear behavior.

The drive stage 14 amplifies the signal and generates the voltage swing needed to control the image display device 12. In a typical image display device the power supply voltage difference Vcc–Vee needed to realize this is 100 Volts or more and frequency components of up to 10–20 Mhz are amplified. The load formed by the image display device 12 typically has a capacitive component of the order of 10 pF, which means that 10–100 mA of output current are needed, which, in view of the large voltage swing, involves a considerable amount of power dissipation.

To ensure broadband gain, the gain is preferably provided by the n-type transistors T1, T2, T3 of the drive stage and not by the current mirror T4, T5. This is because pnp type transistors cause a lower cut-off frequency than npn type transistors. The current mirror T4, T5 preferably has a gain of about 1.

The npn transistors T1, T2, T3 provide gain as follows. The voltage source supplies a voltage approximately equal to twice the base emitter junction voltage needed to make a transistor significantly conductive, for silicon transistors for example 1.2–1.4 Volts. The sum of the base emitter voltages of the control transistor T2 and the pull transistor T3 is equal to the voltage V provided by voltage source 148.

$V = Vbe2 + Vbe3$

The currents I2, I3 through these transistors depend approximately exponentially on the base emitter voltages:

$I2 = I0\ \exp(Vbe2/V0)$ and $I3 = I0\ \exp(Vbe3/V0)$

Where "exp" is the exponential function (power of e) $V0 = kT/q$, k being Boltzmann's constant, T being absolute temperature and q being the electron charge. I0 is a current factor which depends on the semiconductor properties and is roughly proportional to emitter size. As a result $I2 * I3 = $ Constant determined by $V$ The input transistor T1 draws a current I1 from node 142 dependent on the control voltage Vin at its control electrode, which is directly driven by the preamplifier 16. The current I1 substantially flows through the main current channel of the control transistor T2 (neglecting base currents etc.). As a result $$I2=I1 \text{ and } I3=C/I1$$

The current I2 is fed to the input of the current mirror T4, T5 and thereby determines the current through the push transistor T5 to the output 146 The current I3 is the current through the pull transistor T3 to the output. The quiescent current Iq of the circuit is the current when the push transistor T5 and the pull transistor T3 draw the same current (so that no net current flows to the output 146). The quiescent current is the square root of C The quiescent current occurs when a certain voltage Vq is applied to the control electrode of the input transistor T1. When T1, T2 and T3 are all of the same size Vq is half the voltage V.

Both the pull current I3 and the push current I2 depend exponentially on Vin:

$$I2=Iq \; \exp((Vin-Vq)/V0)$$

$$I3=Iq \; \exp(-(Vin-Vq)/V0)$$

By raising Vin above Vq an unlimited increase can be realized (in principle) in the current to the output via the push transistor T5. At the same time the current I3 through the pull transistor T3 is brought increasingly closer to zero. Conversely, by lowering Vin, the current I3=C/I1 through the pull transistor can be raised without limitation in principle, while at the same time the current through the pull transistor T5 is brought increasingly closer to zero. It will be appreciated that the value of Vq, which depends on the voltage of the voltage source 148 is not critical: it merely serves to define the quiescent level. Of course, this operation does not depend linearly on Vin, but if linear operation is required use may be made of the feedback circuit 18 to ensure linear operation, or a pre-processing circuit with a logarithmic I/O dependence may be used to make Vin depend in such a way on its input signal that the net output current of the output stage depends linearly on the input signal. If linear operation is not needed no such circuits are required of course.

Thus, the drive stage 14 of FIG. 1 realizes class AB operation, that is, operation where the quiescent current is lower than the maximum possible output current. As can be seen from the equations, the quiescent state (when no net current flows to the output 146) occurs when Vin=Vq, that is, when Vi=V/2 in the case that the npn transistors T1, T2, T3 are equal and the pnp current mirror T4, T5 has unity gain. In some applications it is undesirable that the voltage level of Vin at which the quiescent state occurs is such an intrinsic property of the circuit.

Figure 2:
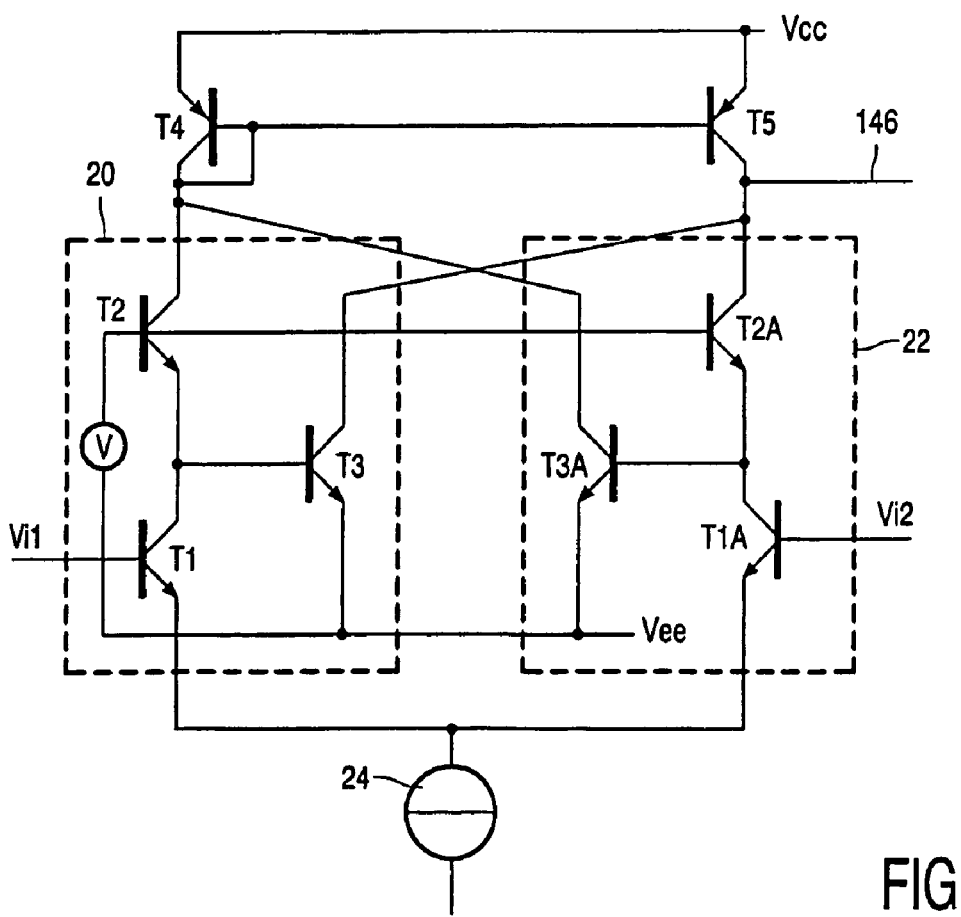
FIG. 2 shows a further image display apparatus according to the invention

FIG. 2 shows a driver stage in which a class A/B output stage according to the invention is realized with a differential input. Except for the circuit 20 of transistors T1, T2, T3 that have already been discussed, this circuit contains a symmetric counterpart 22 of this circuit with input transistor T1A, control transistor T2A and pull transistor T3A. The circuit 20 and its counterpart 22 form two branches 20, 22 that are coupled as follows. The emitters of input transistor T1 and its counterpart T1A are coupled to a further power supply terminal (not shown) via a common current source 24, which keeps the sum of the currents through the main current channels of these transistors T1, T1A substantially constant. The emitters of T3 and T3A are coupled together, but the sum of their emitter currents is not kept constant. The collectors of transistors T3 and T3A in the circuit 20 and its counterpart 22 are cross-coupled to the collectors of the transistors T2 and T2A in the symmetric counterpart 22 and the circuit 20 respectively.

In operation a differential input voltage controls the distribution of the current from the current source over input transistors T1 and T1A:

$$IT1=Is/(1+\exp(-(V1-V2)/Vo))$$

$$IT1A=Is-I1$$

(Is is the current from the current source 24 and V1, V2 are the voltages at the input). If one of the input transistors T1, T1A is starved of current, this leads to a large current through the main current channel of the pull transistor T3, T3A to which it is attached:

$$IT3 = C/IT1$$
$$= (1 + \exp(-(V1-V2)/Vo)) * C/Is$$

A large current through the pull transistor occurs in either branch 20, 22 symmetrically, when the difference between V1 and V2 becomes very positive and very negative respectively. Due to the cross-coupling of the collectors of the control transistors T2, T2A and the pull transistors T3, T3A this leads to an output current of $$Ioutput \quad 2=Is/(1+\exp(+(V1-V2)/Vo))+(1+\exp(-(V1-V2)/Vo))*C/Is$$

The other output current depends in the same way on V1−V2, but with the positions of V1 and V2 exchanged. It will be appreciated that the output currents once more have the desirable property for class A/B output stages that an in principle unlimited (exponential) increase in output current can be realized by raising V2−V1 and that this output current is not bounded by the quiescent current (current through both branches when both branches 20, 22 draw the same current). The quiescent state of the output circuit is attained when V1=V2. The required input voltage does not depend on intrinsic properties of the transistors in the circuit.

It will be appreciated that to realize this effect the current source 24 is used to ensure that current distribution between the input transistors T1, T1A does not depend appreciably on the common mode voltage of V1 and V2. That is, the high impedance of the current source 24 is important for the circuit, not the exact value of the current from the current source 24 not its constancy. Similarly it will be appreciated that, although cross-coupled control transistors T2A, T2 and pull transistors T3, T3A are shown, such cross-coupling is not essential. For example the control transistors T2, T2A might be coupled to the power supply Vcc. This solution is less power efficient than the circuit shown, but still serves the function of providing a class A/B stage.

Although the circuit according to the invention has been described in terms of bipolar transistors it will be appreciated that class A/B operation can be realized similarly with MOS (IGFET) transistors, FETs in general or with combinations of bipolar transistors and FETs. Of course this will mean that the equations discussed above no longer apply, but the principle that the net output current can increase in either direction without being limited by the quiescent current still applies. In this case the voltage supplied by the voltage source 148 may be altered accordingly. However, a drive stage with bipolar transistors is preferred, because it allows the strongest output currents.

Similarly, it will be appreciated that the same effect can be realized when not all transistors of the circuit have the same size or when several transistors in parallel are used to realize the function of a single transistor. Also it will be appreciated that without deviating from the invention transistors may be added to the circuit, for example with their main current channel in series with the collector of the various transistors. This may be done to reduce the effect of dependence of the main transistor current on the collector voltage. Such transistors do not affect the invention as long as the input transistor T1 or transistors T1, T1A are arranged so that a control voltage at its or their inputs can cause an increase in both the push and pull output current that is not limited by the quiescent current, by drawing a current from main current channel of the control transistor T2, T2A that disturbs the ratio between the currents through main current channels of the control transistor T2, T2A and the pull transistor T3, T3A.

As a result a drive stage is realized that is capable of operating with the high supply voltages that are needed for controlling the display screen device 12 (for example CRT) with a large bandwidth, will at the same time minimizing the dissipated power, which is necessary for incorporating the circuit in an integrated circuit.

It should be noted that the above-mentioned embodiments illustrate rather than limit the invention, and that those skilled in the art will be able to design many alternative embodiments without departing from the scope of the appended claims. For example, the claims explicitly also cover the situation in which all n-type transistors are replaced by p-type transistors and in which all p-type transistors and current mirrors are replaced by n-type transistors and current mirrors, respectively. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. An image display apparatus, comprising:
a display screen device with a drive input; and
a driver circuit comprising a push-pull stage with an output coupled to the drive input, the driver circuit comprising:
an n-type pull transistor with a main current channel coupled to the drive input;
an n-type control transistor with a main current channel terminal coupled to a control electrode of the pull transistor via a node;
a voltage source for applying a predetermined voltage over a series connection of the control electrode-main current channel terminals of the control transistor and the pull transistor;
a p-type current mirror with an output transistor that serves as push transistor for the push-pull stage and an input fed by the main current channel of the control transistor; and
an input transistor with a main current channel coupled to said node, the input transistor having a control electrode coupled to an input of the driver circuit, the input transistor being arranged to draw substantially all of a variable part of the current from the control transistor, an external input of the apparatus having a coupling to the control electrode of the input transistor that does not include the main current channel through the control transistor.

2. An image display apparatus according to claim 1, the driver circuit comprising a first and a second branch, the first branch comprising the pull transistor, the control transistor and the input transistor, the second branch comprising a further pull transistor, a further control transistor and a further input transistor, interconnected as the pull transistor, the control transistor and the input transistor in the first branch, the driver circuit comprising a current source that connects the main current channels of the input transistor and the further input transistor in common to a supply voltage.

3. An image display apparatus according to claim 2, wherein the main current channel of the further pull transistor of the second branch is coupled to the input of the current mirror in parallel with the main current channel of the control transistor of the first branch.

4. An image display apparatus according to claim 2, wherein the main current channel of the further control transistor of the second branch is coupled to the drive input in parallel with the main current channel of the pull transistor of the first branch.

5. An integrated circuit with an output contact and a push-pull stage with an output coupled to the output contact, the integrated circuit comprising:
an n-type pull transistor with a main current channel coupled to the output;
an n-type control transistor with a main current channel terminal coupled to a control electrode of the pull transistor via a node;
a voltage source for applying a predetermined voltage over a series connection of the control electrode-main current channel terminals of the control transistor and the pull transistor;
a p-type current mirror with an input fed by the main current channel of the control transistor and an output transistor that serves as push transistor for the push-pull stage; and
an input transistor with a main current output coupled to said node, the input transistor having a control electrode coupled to an input of the driver circuit, arranged to control substantially all of a variable part of the current through the control transistor, an external input of the apparatus having a coupling to the control electrode of the input transistor that does not include the main current channel through the control transistor.

6. An integrated circuit according to claim 5, comprising a first and a second branch, the first branch comprising the pull transistor, the control transistor and the input transistor, the second branch comprising a further pull transistor, a further control transistor and a further input transistor, interconnected as the pull transistor, the control transistor and the input transistor in the first branch, the driver circuit comprising a current source that connects the main current channels of the input transistor and the further input transistor in common to a supply voltage.

7. An integrated circuit according to claim 6, wherein the main current channel of the further pull transistor of the second branch is coupled to the input of the current mirror in parallel with the main current channel of the control transistor of the first branch.

8. A driver circuit comprising a push-pull stage comprising:
- an output;
- a pull transistor of a first conductivity type with a main current channel coupled to the output;
- a control transistor of the first conductivity type with a main current channel terminal coupled to a control electrode of the pull transistor via a node;
- a voltage source for applying a voltage across a series connection of the control electrode-main current channel terminals of the control transistor and the pull transistor;
- a current mirror of a second conductivity type opposite to the first conductivity type, with an input fed by the main current channel of the control transistor and an output transistor that serves as push transistor for the push-pull stage; and
- an input transistor with a main current output coupled to said node, the input transistor having a control electrode coupled to an input of the driver circuit, arranged to control substantially all of a variable part of the current through the control transistor, an external input of the driver circuit having a coupling to the control electrode of the input transistor that does not include the main current channel through the control transistor.

9. A driver circuit according to claim 8, comprising a first and a second branch, the first branch comprising the pull transistor, the control transistor and the input transistor, the second branch comprising a further pull transistor, a further control transistor and a further input transistor, interconnected as the pull transistor, the control transistor and the input transistor in the first branch, the driver circuit comprising a current source that connects the main current channels of the input transistor and the further input transistor in common to a supply voltage.

* * * * *